(12) United States Patent
Kinyanjui et al.

(10) Patent No.: US 10,672,690 B2
(45) Date of Patent: Jun. 2, 2020

(54) METHOD FOR MANUFACTURING AN ELECTRONIC ASSEMBLY

(71) Applicant: Deere & Company, Moline, IL (US)

(72) Inventors: Robert K. Kinyanjui, West Fargo, ND (US); Thomas J. Roan, Fargo, ND (US); Michael J. Zurn, Pelican Rapids, MN (US); Brad G. Palmer, Fargo, ND (US); Brij N. Singh, West Fargo, ND (US)

(73) Assignee: DEERE & COMPANY, Moline, IL (US)

(*) Notice: Subject to any disclaimer, the term of this patent is extended or adjusted under 35 U.S.C. 154(b) by 0 days.

(21) Appl. No.: 16/580,778

(22) Filed: Sep. 24, 2019

(65) Prior Publication Data
US 2020/0020619 A1    Jan. 16, 2020

Related U.S. Application Data

(62) Division of application No. 15/445,052, filed on Feb. 28, 2017, now Pat. No. 10,461,021.

(51) Int. Cl.
*H01L 23/495* (2006.01)
*H01L 23/00* (2006.01)

(52) U.S. Cl.
CPC .. *H01L 23/49568* (2013.01); *H01L 23/49541* (2013.01); *H01L 24/33* (2013.01); *H01L 24/83* (2013.01); *H01L 2224/29347* (2013.01); *H01L 2224/29444* (2013.01); *H01L 2224/29455* (2013.01); *H01L 2224/32245* (2013.01);
(Continued)

(58) Field of Classification Search
CPC ......... H01L 23/49568; H01L 23/49541; H01L 24/83
See application file for complete search history.

(56) References Cited

U.S. PATENT DOCUMENTS

| 4,740,252 A | 4/1988 | Hasegawa et al. |
| 5,135,890 A | 8/1992 | Temple et al. |

(Continued)

FOREIGN PATENT DOCUMENTS

| WO | 2014082100 A1 | 5/2014 |
| WO | 2016094059 A1 | 6/2016 |

(Continued)

OTHER PUBLICATIONS

Kulanayagam, J. et al., "Reduction of Heat Sink Common-Mode Currents in Switching Mode Power Supply Circuits", Advances in Radio Science, Aug. 1, 2011, vol. 9, pp. 317-321 [online] [retrieved Jun. 23, 2017]. Retrieved from: <URL www.adv-radio-sci.net/9/317/2011/>.

*Primary Examiner* — Marc Anthony Armand

(57) ABSTRACT

A method for manufacturing an electronic assembly features a semiconductor device with a first side and a second side opposite the first side to facilitate enhanced thermal dissipation. The first side has a first conductive pad. The second side has a primary metallic surface. By heating the assembly once, a first substrate (e.g. lead frame) is bonded to a first conductive pad via first metallic bonding layer; and second substrate (e.g., heat sinking circuit board) is bonded to a primary metallic surface via a second metallic bonding layer. In one configuration the second metallic bonding layer is composed of solder and copper, for example.

5 Claims, 11 Drawing Sheets

(52) U.S. Cl.
CPC ............. *H01L 2224/33181* (2013.01); *H01L 2924/1203* (2013.01); *H01L 2924/13055* (2013.01)

(56) References Cited

U.S. PATENT DOCUMENTS

| | | | |
|---|---|---|---|
| 6,013,877 | A | 1/2000 | Degani et al. |
| 6,294,478 | B1 | 9/2001 | Sakaguchi et al. |
| 6,639,327 | B2 | 10/2003 | Momoi et al. |
| 8,916,474 | B2 | 12/2014 | Otremba et al. |
| 9,240,371 | B2 * | 1/2016 | Ishino ................. H01L 23/4006 |
| 2006/0061974 | A1 | 3/2006 | Soga et al. |
| 2010/0127388 | A1 * | 5/2010 | Stanley ............... H01L 23/3733 257/712 |
| 2014/0299916 | A1 | 10/2014 | Bourennane et al. |
| 2015/0243609 | A1 | 8/2015 | Lamorey et al. |
| 2016/0351468 | A1 | 12/2016 | Liang |

FOREIGN PATENT DOCUMENTS

| | | |
|---|---|---|
| WO | 2016130772 A1 | 8/2016 |
| WO | 2016174584 A1 | 11/2016 |

\* cited by examiner

METHOD FOR MANUFACTURING AN ELECTRONIC ASSEMBLY

CROSS-REFERENCE TO RELATED APPLICATIONS

This is a divisional of U.S. patent application Ser. No. 15/445,052, filed Feb. 28, 2017, which is incorporated herein by reference.

FIELD

This disclosure relates to a method for manufacturing an electronic assembly.

BACKGROUND

Certain prior art uses bonded wire to connect the leads of a semiconductor device to a semiconductor package or substrate. However, the thermal dissipation, the operational temperature range, or the maximum operating temperature of the semiconductor device may be limited because of the bonded wire connections. Some semiconductor devices may use silicon carbide for its superior power handling capabilities. However, silicon carbide presents challenges in semiconductor packaging with respect to providing adequate thermal dissipation. Thus, there is a need for an electronic assembly with enhanced thermal dissipation.

SUMMARY

In accordance with one aspect of the disclosure, a method for manufacturing an electronic assembly features a semiconductor device with a first side and a second side opposite the first side to facilitate enhanced thermal dissipation. The first side has a first conductive pad. The second side has a primary metallic surface. By heating the assembly once, a first substrate (e.g. lead frame) is bonded to the first conductive pad via first metallic bonding layer; a second substrate (e.g., heat sinking circuit board) is bonded to the at least primary metallic surface via a second metallic bonding layer. In one configuration the second metallic bonding layer is composed of solder and copper, for example.

BRIEF DESCRIPTION OF THE DRAWINGS

In any group of the drawings, like reference numbers indicate like elements, features, processes or steps.

DETAILED DESCRIPTION

Figure 1:
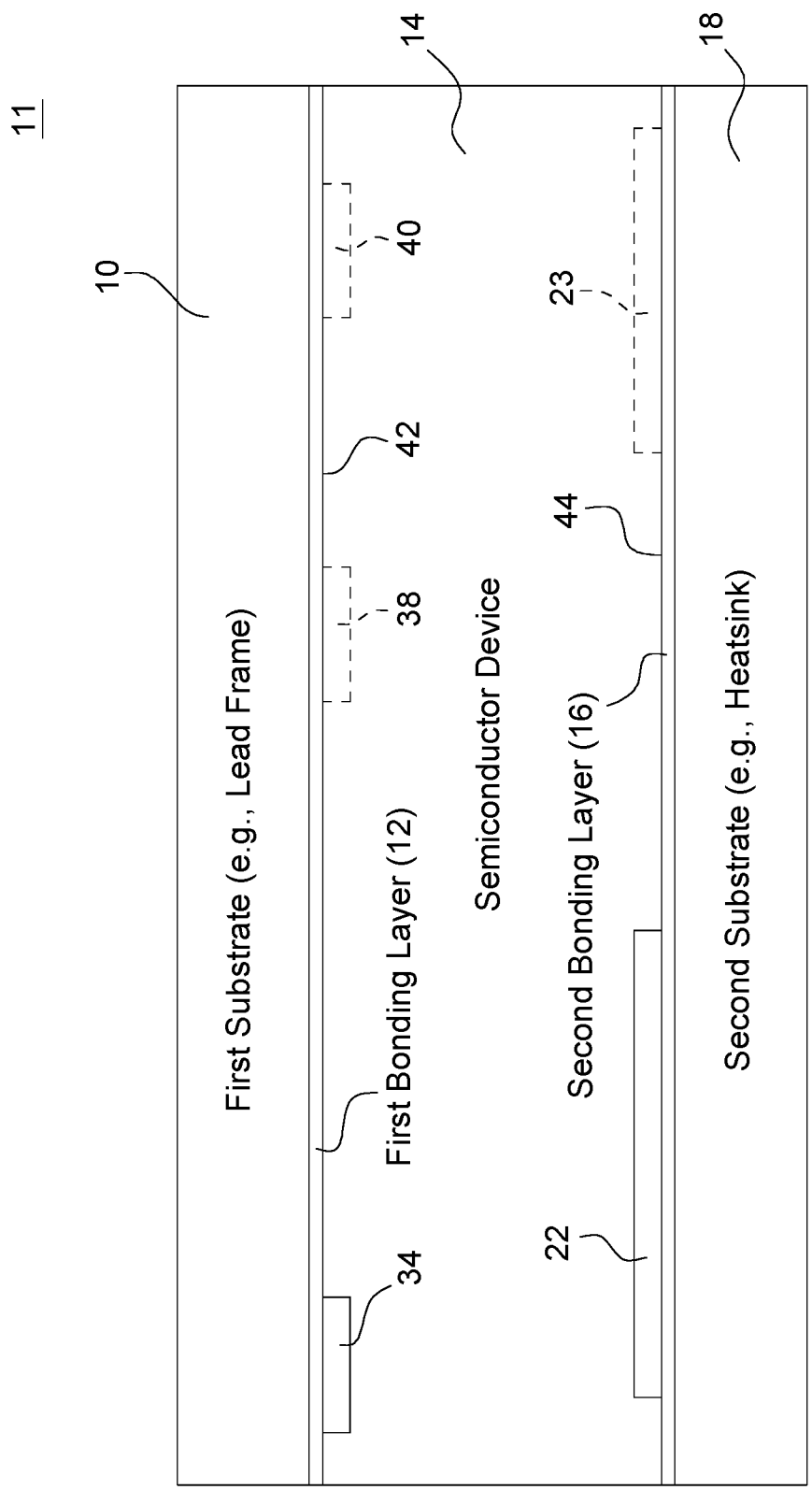
FIG. 1 is one embodiment of a block diagram that is representative of a cross-section of an electronic assembly of the disclosure.

FIG. 1 is a block diagram that is representative of a cross-section of one embodiment of an electronic assembly 11 of the disclosure. In accordance with FIG. 1, an electronic assembly 11 comprises a semiconductor device 14 with a first side 42 and a second side 44 opposite the first side 42. The first side 42 has a first conductive pad 34. The second side 44 has a primary metallic surface 22. A first substrate 10 (e.g. lead frame) is bonded to the first conductive pad 34 via first metallic bonding layer 12. A second substrate 18 (e.g., heat sink or heat-sinking circuit board) is bonded to the primary metallic surface 22 via a second metallic bonding layer 16.

The first bonding layer 12 provides an electrical and mechanical connection between the first conductive pad 34 and the first substrate 10 (e.g., one or more lead frames). Alternatively, the first bonding layer 12 provides a set of respective electrical and mechanical connections to different terminals of a lead frame for a corresponding first conductive pad 34, a corresponding second conductive pad 38 and corresponding third conductive pad 40.

The second bonding layer 16 provides an electrical and mechanical connection between the primary metallic surface 22 and the second substrate 18 (e.g., heat sink or heat-sinking circuit board). Alternatively, the second bonding layer 16 provides an electrical and mechanical connection between the primary metallic surface 22, the secondary metallic surface 23 and the second substrate (e.g. heat sink or heat sinking circuit board).

In one embodiment, the first bonding layer 12 is composed of solder; the second bonding layer 16 is composed of solder or both solder and copper material. However, in an alternate embodiment, the first bonding layer 12 is composed of both solder and copper material.

In the first bonding layer 12, the second bonding layer 16, or both, the copper content (e.g., copper pellets) can facilitate enhanced heat dissipation from the semiconductor device 14. Further, the copper content can promote improved thermo-mechanical strength of one or more bonding layers (12, 16). For example, in one embodiment, the copper (in the first bonding layer 12) lowers a homologous temperature of the first bonding layer 12 to facilitate greater mechanical strength (e.g., sheer, tensile and/or compressive strength) of a bond between the first bonding layer 12 and the first conductive pad 34. Similarly, in one embodiment, the copper (in the second bonding layer 16) lowers a homologous temperature of the second bonding layer 16 to facilitate greater mechanical strength (e.g., sheer, tensile and/or compressive strength) of a bond between the second bonding layer 16 and the primary metallic surface 22.

In one configuration, the semiconductor device 14 has a primary coefficient of thermal expansion (CTE), whereas the first substrate 10 (e.g., lead frame) or secondary substrate 18 (e.g., heatsink) has a secondary coefficient of thermal expansion (CTE), and wherein the copper in the first bonding layer 12 or the second bonding layer 16, respectively, reduces a mismatch (and associated thermal stress) between the primary CTE and the secondary CTE.

In an alternate embodiment, the semiconductor device 14 further comprises a second conductive pad 38 and a third conductive pad 40 on the first side 42. As shown in FIG. 1, the second pad 38 and the third conductive pad 40 are optional as indicated by the dashed lines. Similarly, in an alternate embodiment, the semiconductor device 14 further comprises a secondary metallic surface 23, which is optional as indicated by the dashed lines in FIG. 1.

Any or all of the conductive pads (34, 38, 40) are composed of electrically conductive materials, such as metal (e.g., copper), alloys or metallic materials.

Figure 2:
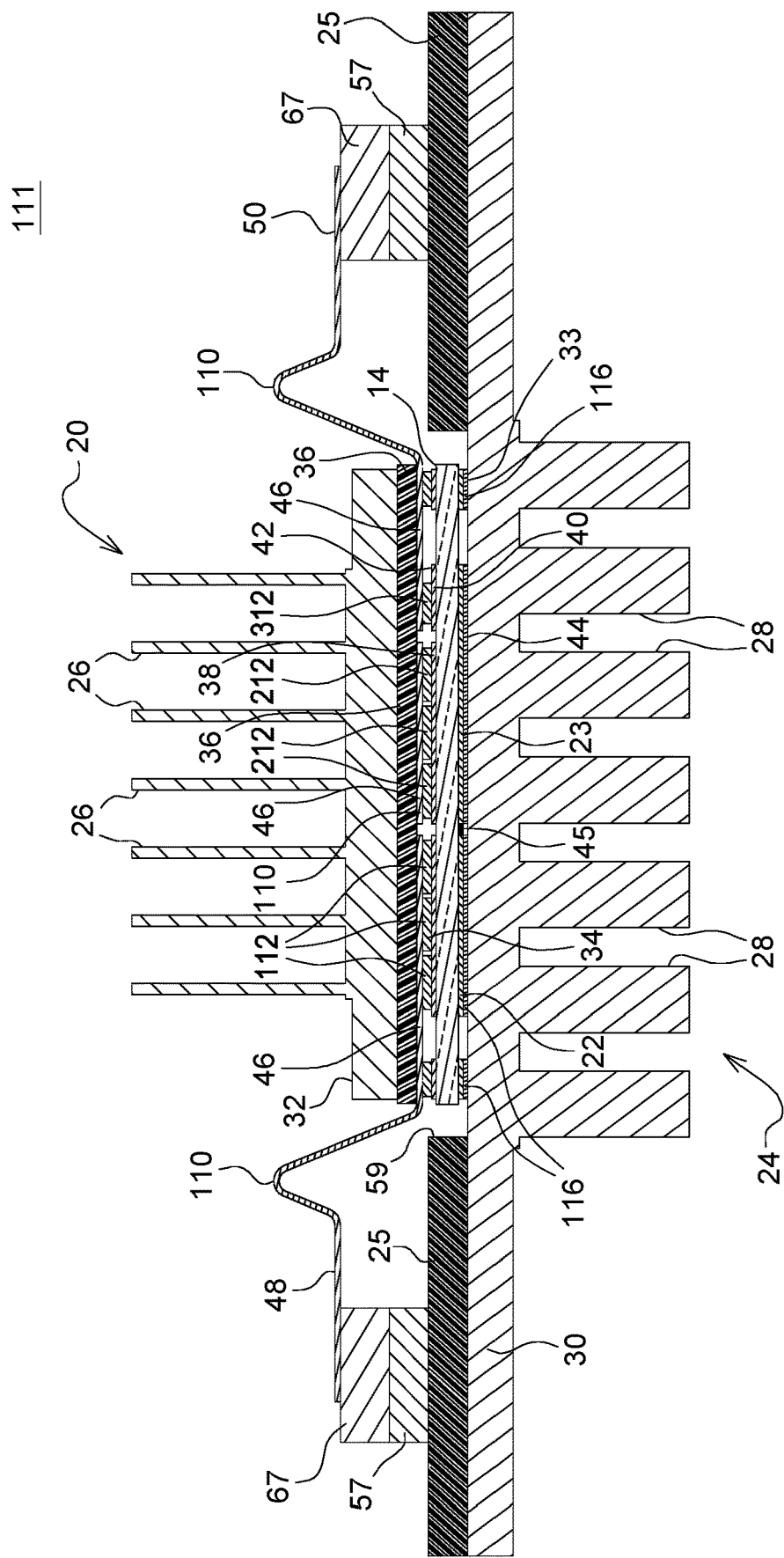
FIG. 2 is another embodiment of a cross-section of an electronic assembly as viewed along reference line 2-2 of FIG. 3A.
Figure 3B:
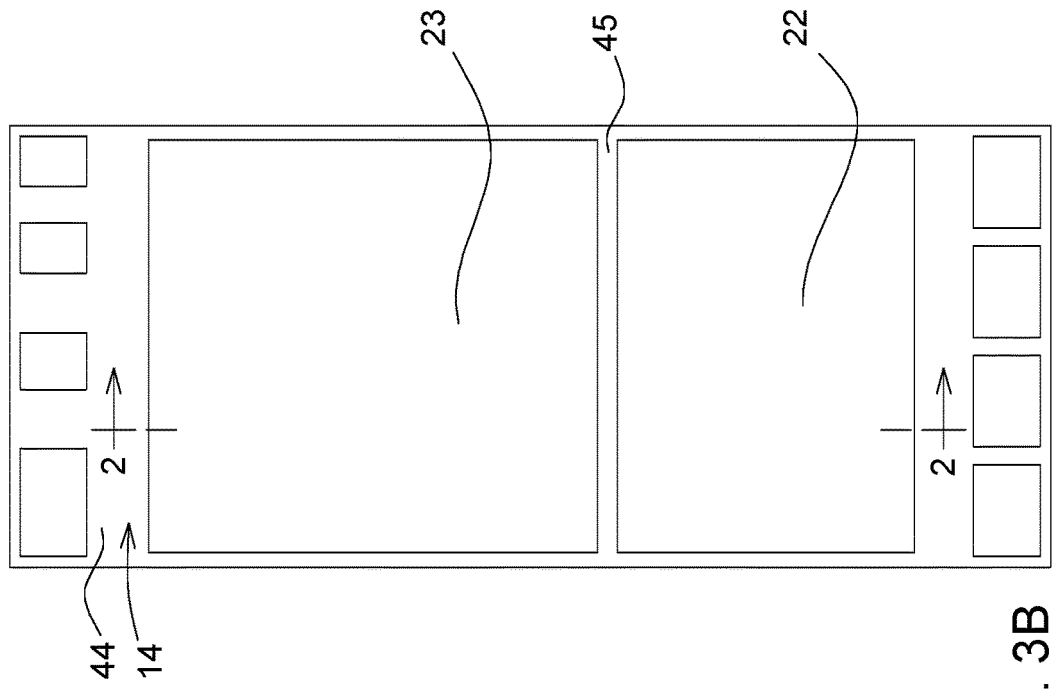
FIG. 3B is a plan view of a second side (e.g., lower side) of one illustrative embodiment of the semiconductor device, consistent with FIG. 2 and FIG. 3A.
Figure 3A:
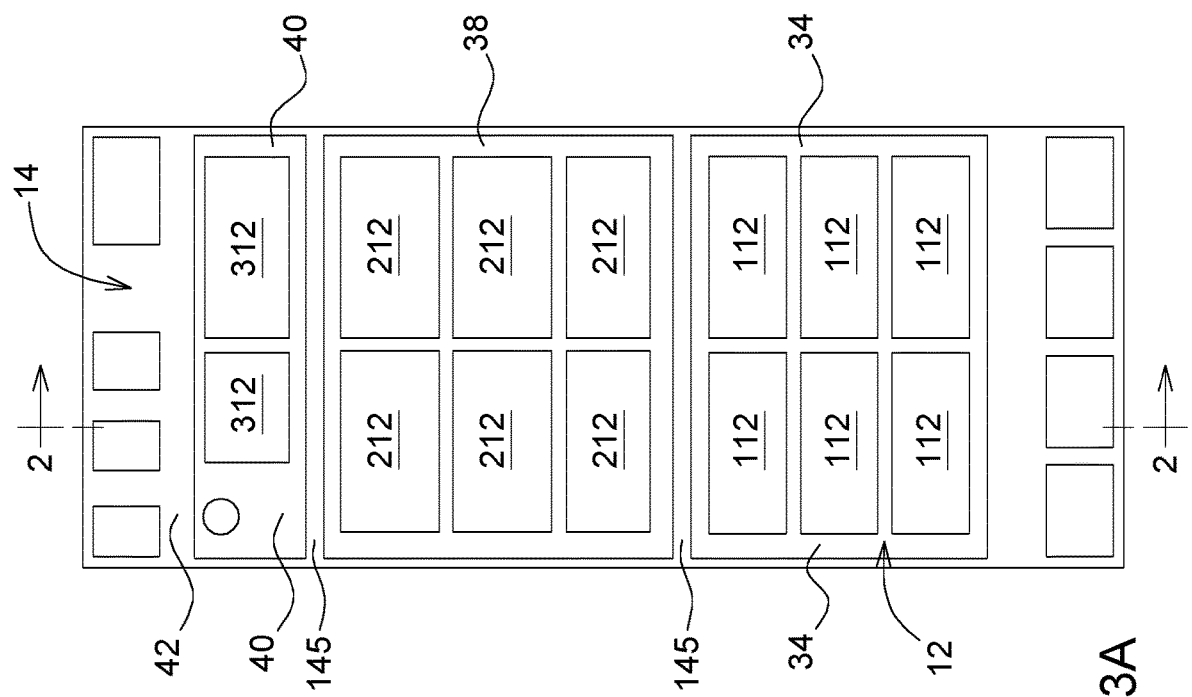
FIG. 3A is a plan view of a first side (e.g., upper side) of one illustrative embodiment of a semiconductor device in accordance with FIG. 2.

FIG. 2 is an embodiment of a cross-section of an electronic assembly 111 taken along reference line 2-2 of FIG. 3A and FIG. 3B. FIG. 2 shows an illustrative example of one possible cross-section of an electronic assembly 111. Like reference numbers in any permutation of FIG. 1, FIG. 2, FIG. 3A and FIG. 3B indicate like elements or features.

First Substrate or Lead Frame

In one embodiment, the first substrate comprises one or more lead frames 110 for interfacing with at least the first conductive pad 34 on a respective semiconductor device 14. In another embodiment, the first substrate comprises a plurality of lead frames 110 for interfacing with the corresponding first conductive pads 34 on a corresponding plurality of respective semiconductor devices 14. As illustrated in FIG. 2, each lead frame 110 engages, interfaces or registers with the corresponding conductive pad 34, the corresponding second conductive pad 38 and corresponding third conductive pad 40 associated with the first side 42 of the semiconductor device 14, such as semiconductor die.

In one embodiment, as best illustrated in FIG. 2 and FIG. 3A, the first conductive pad 34 may comprise a continuous metallic member (e.g., with a rectangular or polygonal surface area), where a first matrix 112 of solder paste is placed on a grid, array or pattern of islands on the first conductive pad 34; the second conductive pad 38 may comprise a continuous metallic member (e.g., with a rectangular or polygonal surface area), where a second matrix 212 of solder paste is placed on a grid, array or pattern of islands on the second conductive pad 38; the third conductive pad 40 may comprise a continuous metallic member (e.g., with a rectangular or polygonal surface area), where a third matrix 312 of solder paste is placed on a grid, array or pattern of islands on the third conductive pad 40. The solder paste is reflowed during the manufacturing of the assembly 111, for example. Collectively, the first matrix 112 of solder paste, the second matrix 212 of solder paste and the third matrix 312 of solder paste may be referred to as the first bonding layer 12.

In an alternate embodiment, a set of first conductive pads comprise a grid or array of conductive metallic islands that are spaced apart by a lateral gap (e.g., lateral dielectric gap or air gap) on the first side 42 of the semiconductor device 14. Similarly, a set of second conductive pads comprise a grid or array of conductive metallic islands that are spaced apart by a lateral gap (e.g., lateral dielectric gap or air gap) on the first side 42 of the semiconductor device 14; a set of third conductive pads comprise a grid or array of conductive metallic islands that are spaced apart by a lateral gap (e.g., lateral dielectric gap or air gap) on the first side 42 of the semiconductor device 14. In the alternate embodiment, the first, second and third matrices (112, 212, 312) of solder paste are spatially aligned with, and coextensive in size and shape with, the underlying set of first conductive pads, the underlying set of second conductive pads and the underlying set of third conductive pads.

In one configuration, each lead frame 110 has a substantially planar portion 46 that has a lower surface for interfacing with the first conductive pad 34 on the semiconductor device 14 and an upper surface for coupling or receiving, directly or indirectly, a first heat sink 20. Further, the substantially planar portion 46 may interface with the first conductive pad 34, the second conductive pad 38 and the third conductive pad 40. For example, each first bonding layer 12 may interconnect one or more lead frames 110 (via its lower surface) to the corresponding first conductive pad 34, the corresponding second conductive pad 38 and the corresponding third conductive pad 40 of one or more respective semiconductor devices 14. Further, the first conductive pad 34 is associated with a corresponding first terminal of the semiconductor device 14, the second conductive pad 38 is associated with a corresponding second terminal of the semiconductor device 14 and the third conductive pad 40 is associated with a third terminal of the semiconductor device 14, where each terminal represents a distinct node or port (e.g., input or output port) of the semiconductor device 14. Although other configurations of the terminals are possible, in one configuration the first terminal comprises an anode of a diode, wherein the second terminal comprises an emitter or source of a transistor and the third terminal comprises a base or a gate of the transistor.

The first bonding layer 12 may comprise a continuous metallic layer (e.g., after reflow of the solder or solder and copper) or may comprise a first matrix 112, a second matrix 212, and a third matrix 312 (e.g., grid or array in one or two dimensions) of discontinuous conductive islands that are spaced apart by at least one lateral air gap or lateral isolation gap to support different leads or terminals for each semiconductor device 14. In one configuration, the first terminal or first conductive pad 34 is associated with the respective first matrix 112, the second terminal or second conductive pad 38 is associated with the respective second matrix 212, and the third terminal or third conductive pad 40 is associated with the third matrix 312.

As illustrated, a thermal interface layer 36 (e.g., dielectric thermal interface material) or other dielectric layer is disposed between the lead frame 110 (or its upper surface) and the first heat sink 20, or its first base 32. In one configuration, the first heat sink 20 has a substantially planar mating surface or first base 32 for adjoining the thermal interface material 36. Fins 26, ridges or other protrusions extend outward from a side of the first heat sink 20 that is opposite the substantially planar mating surface.

In one embodiment, the first substrate comprises a lead frame 110 having a substantially planar portion 46 with a series or grid of holes 54 (in FIG. 5) for interfacing with the first bonding layer 12 (e.g., first metallic bonding layer). For example, the first substrate comprises a lead frame 110 that is capable of laterally spreading or dissipating heat to reduce any temperature differential within different portions of the electronic assembly 111, or among a plurality of semiconductor devices 14 of the electronic assembly 111.

Second Substrate

As illustrated in FIG. 2, the second substrate comprises a second heat sink 24 with a second base 30. The second base 30 has a substantially planar surface for interconnection with the primary metallic surface 22, the secondary metallic surface 23, or both, of the one or more semiconductor devices 14. The second bonding layer 16 facilitates the interconnection between the second base 30 or second heat sink 24 and the primary metallic surface 22, the secondary metallic surface 23 or both of the one or more semiconductor devices 14. Fins 28, ridges or other protrusions extend outward from a side of the second heat sink 24 that is opposite the substantially planar surface.

Metallic Bonding Layers

In one embodiment, the first bonding layer 12 may comprise one or more of the following matrices of solder paste or a combination of solder paste and copper material: a first matrix 112, a second matrix 212 or a third matrix 312. In one embodiment, the first bonding layer 12 or first metallic bonding layer is composed of solder material, such as a composition of tin and silver, lead solder, or another suitable lead-free solder material. In an alternate embodiment, the first bonding layer 12 may comprise a combination of solder and copper material. For example, the first bonding layer 12 comprises solder material (e.g., a lead-free solder material) and copper pellets coated with a solderable finish such as tin, silver or electroless nickel immersion gold (ENIG).

In one embodiment, the solder material or solder paste is a lead-free solder material or alloy composition, such as tin-silver, tin-silver-copper, or tin-gold, or tin and one or more other metallic elements, such as antimony, bismuth, indium, or zinc. For example, tin-silver-copper solder alloy composition can be composed of approximately 2.5 to 4 percent silver by mass, approximately 0.25 to 1 percent copper by mass with the remaining mass being tin or a composition of tin. For solder paste, the solder powder size range should be: 20-38 microns and the solder paste is 90 percent metal load (percentage-by-weight of solder in the paste).

In alternate embodiments, solder paste can contain lead, such as tin-silver-lead or tin-lead, if the lead-containing solder material is authorized under applicable law and regulations, such as military specifications.

In one embodiment, copper material or additional copper material is added to the above solder material or alloy composition, such that the copper content may exceed the range of 0.25 to 1 percent copper by mass of the first bonding layer 12 of the second bonding layer 16. For example, embedded copper material in the solder paste can be in the form of discs plated with a solderable finish such as tin, silver, or ENIG, among other possibilities. In one illustrative configuration, the diameter and thickness of the disc is 0.025 inches (0.625 mm) with a tolerance of ±0.002 inches and 0.010 inches (0.25 mm) with a tolerance of ±0.001 inches respectively and the percentage volume in the solder paste/copper composite ranges from approximately 15 percent to approximately 40 percent. In one embodiment, the second bonding layer 16 may comprise one or more separate islands, bodies, or matrices (e.g., 116 in FIG. 7) of solder paste or a composition (e.g., alloy composition) of solder (e.g., lead-free solder, even including up to 1 percent copper by mass) and copper material (e.g., copper particles, copper flakes, copper pellets, or copper filler). In one configuration, the second bonding layer 16 or second metallic bonding layer is composed of copper material and solder material, such as a composition of tin and silver, lead solder, or another suitable lead-free solder material. In one embodiment, the copper comprises copper pellets coated with tin, silver, or electroless nickel immersion gold. The copper is well-suited to lower a homologous temperature of the second bonding layer 16 to facilitate greater mechanical strength of a bond between the second bonding layer 16 and the primary metallic surfaces 22.

In one configuration, the semiconductor device 14 is capable of generating heat, the first bonding layer 12 and the second bonding layer 16 comprise metallic materials or thermal interface materials that conduct simultaneously the heat away from one or more semiconductor devices 14 from each first side 42 of each semiconductor device 14 and from each second side 44 of each semiconductor device 14 (among the devices).

In certain configurations, the semiconductor device 14 has a primary coefficient of thermal expansion (CTE) and the first substrate 10 (e.g., lead frames 110) or the second substrate 18 (e.g., second heat sink 24) has a secondary coefficient of thermal expansion (CTE); the copper in the first bonding layer 12 or the second bonding layer 16, respectively, reduces a mismatch (and associated thermal stress) between the primary CTE and the secondary CTE.

Thermal Heat Dissipation

In one embodiment, the electronic assembly 111 comprises a set of semiconductor devices 14. For example, each semiconductor device 14 comprises a semiconductor die, such as an insulated gate bipolar transistor (IGBT) or an insulated gate bipolar transistor and a diode on or in a direct bonded copper carrier or semiconductor substrate. Each semiconductor device 14 is capable of generating heat during normal operation. The first bonding layer 12 and the second bonding layer 16 comprise thermal interface materials that conduct simultaneously the heat away from the semiconductor device 14 from a first side 42 of the semiconductor device 14 and from a second side 44 of the semiconductor device 14. The first substrate comprises one or more lead frames 110 that are capable of laterally spreading or dissipating the heat to reduce any temperature differential within different portions of the electronic assembly 111, or among a plurality of semiconductor devices 14 of the electronic assembly 111.

In one embodiment, the first substrate comprises a lead frame 110 with a substantially planar portion 46 having a lower surface for interfacing with the corresponding first conductive pad 34, second conductive pad 38, and third conductive pad 40 on the semiconductor device 14. Further, the substantially planar portion 46 of the lead frame 110 has an upper surface for coupling or receiving, directly or indirectly, a first heat sink 20. For example, the upper surface of the substantially planar portion 46 (of the lead frame 110) adjoins the dielectric thermal interface material 36 (e.g., thermally conductive adhesive), which is sandwiched between the upper surface and the first heat sink 20 or its first base 32. The lead frame 110 terminates in a first terminal 48 and a second terminal 50, which can be connected to conductive traces 57 on the circuit board 25 via solder joints 67. As illustrated in FIG. 2, the circuit board 25 has an opening 59 of a size and shape to receive the semiconductor device 14 with a peripheral clearance gap. The circuit board 25 may be composed of a ceramic, polymeric, plastic, polymer with glass filler, for example, with conductive traces on one or both sides.

FIG. 3A is a plan view of a first side 42 (e.g., upper side) of one illustrative embodiment of a semiconductor device 14. The first side 42 of the semiconductor device 14 comprises the first conductive pad 34, the second conductive pad 38 and the third conductive pad 40 which are laterally separated from each other by one or more dielectric barriers 145. Each dielectric barrier 145 represents an air gap, a ceramic insulating region, a plastic or polymer insulating region, or another dielectric region. In one embodiment, each first conductive pad 34, each second conductive pad 38 and each third conductive pad 40 is associated with a corresponding lead or terminal of a respective semiconductor device 14. For example, any pad (34, 38 and 40) may represent: (1) a gate pad or base pad, (2) an emitter pad or source pad, (3) an anode pad, or (4) a cathode pad.

Figure 8:
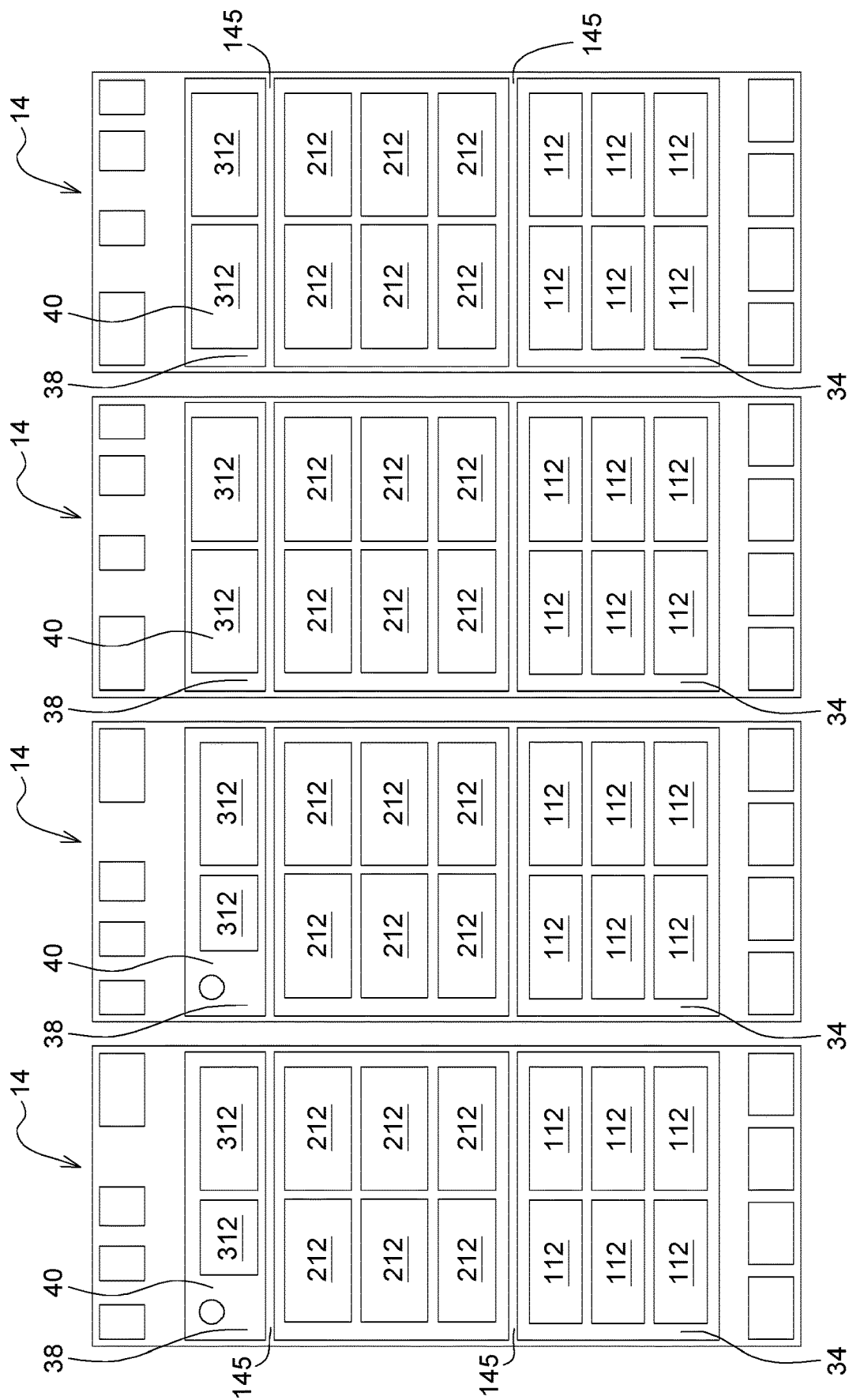
FIG. 8 is a plan view of a plurality of semiconductor devices with solder paste on their respective conductive pads.

An enlarged surface area for a corresponding pad (34, 38, 40) or set of pads of a semiconductor device 14 facilitates enhanced heat dissipation for a semiconductor device 14. As illustrated, the first conductive pad 34, the second conductive pad 38 and the third conductive pad 40 are arranged as a grid or an array of substantially rectangular metallic pads that are separated by dielectric barriers 145, dielectric intermediate regions or dielectric borders, where the pads (34, 38, 40) occupy collectively a majority of the first side 42 of the semiconductor device 14. FIG. 8 illustrates a plane view of four semiconductor devices 14 with the first matrix 112, the second matrix 212 and the third matrix 312 of solder paste deposited on one or more of the following: the at least one first conductive pad 34, the at least one second conductive pad 38 and the at least one third conductive pad 40.

FIG. 3B is a plan view of a second side 44 (e.g., lower side) of one illustrative embodiment of the semiconductor device 14, consistent with FIG. 3A. In one embodiment, the second side 44 of the semiconductor device 14 comprises a primary metallic surface 22, a secondary metallic surface 23, or both. For example, the primary metallic surface 22 may comprise one or more of the following metallic or conductive pads: (1) a gate pad or base pad, (2) a collector pad or drain pad, and (3) a cathode pad, and (4) an anode pad. In one configuration, metallic surfaces (22, 23) with an enlarged surface area for a corresponding terminal of a semiconductor device 14 facilitate enhanced heat dissipation compared to a minimal surface area required to carry the target (e.g., designed or peak load) electrical current from the corresponding terminal of a semiconductor device 14. As illustrated, the primary metallic surface 22 and the secondary metallic surface 23 are arranged as a grid or an array of substantially rectangular metallic pads that are separated by a dielectric region 45, or dielectric borders. The dielectric region 45 represents an intermediate or intervening dielectric barrier between the primary metallic surface 22 and the secondary metallic surface 23. For example, the dielectric region 45 may be defined by an air gap, a ceramic insulating region, a polymeric or plastic insulating region, or another insulating region, where a ceramic or polymeric region that is flush with the primary metallic surface 22 and the secondary metallic surface 23 inhibits the flow of solder (e.g., of the second bonding layer 16) into any gap between the pads that might otherwise form a short circuit or unwanted capacitive coupling. Here, the primary metallic surface 22 and the secondary metallic surface 23 occupy, collectively, a majority of the surface area of the second side 44 of the semiconductor device 14.

Figure 4:
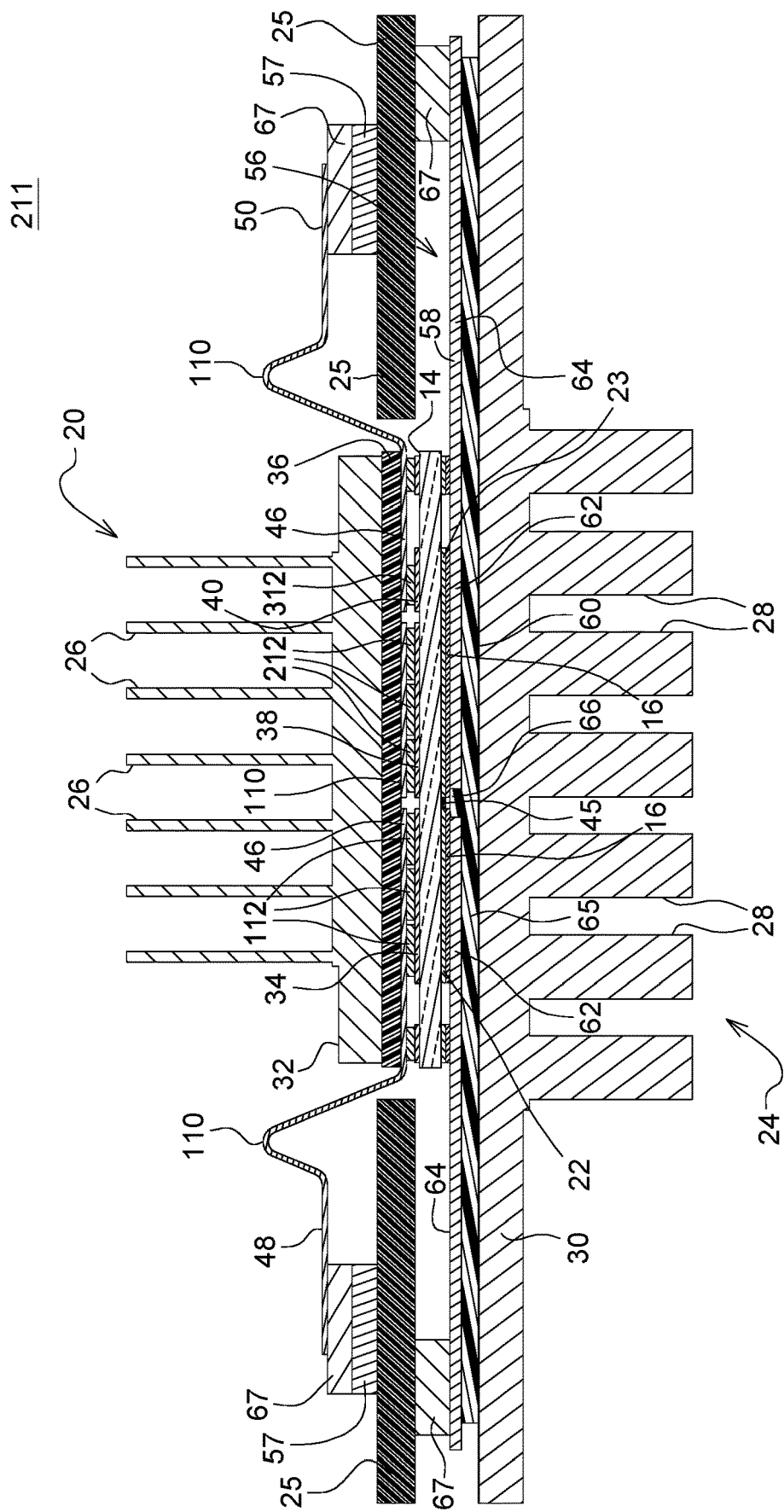
FIG. 4 is a cross-section of an alternate embodiment of an electronic assembly that features an additional substrate (e.g., circuit board) between a semiconductor device and a heat sink.

The electronic assembly 211 of FIG. 4 is similar to the electronic assembly 111 of FIG. 2, except the electronic assembly 211 further comprises a supplemental substrate 56 or circuit board that intervenes between the second substrate or second heat sink 24 and the semiconductor device 14.

As illustrated in FIG. 4, the supplemental substrate 56 comprises a single-sided or double-sided circuit board that has an upper surface 58 with conductive mating surfaces 62 and conductive traces 64 for interfacing with one or more of the following on the semiconductor device 14: (1) primary metallic surface 22, (2) secondary metallic surface 23, or both. As illustrated, a dielectric region 66 separates the conductive mating surfaces 62 into two separate regions that may be associated with corresponding conductive traces 64. Each of the separate regions or conductive traces 64 may be associated with different terminals of the semiconductor device 14, such as a collector terminal of a transistor and a cathode terminal a protective diode associated with the transistor. As shown, the dielectric region 45 is aligned or registered with the dielectric region 66 to maintain electrical isolation and to support discrete separate terminals for the primary metallic surface 22 and the secondary metallic surface 23. Further, the conductive traces 64 may terminate in conductive pads for connection to the circuit board 25, or conductive traces 64 on the circuit board 25 via solder joints 67 or other electrical connections.

As illustrated, a lower surface 60 of the supplemental substrate 56 comprises a dielectric layer 65 that adjoins or contacts a second base 30 of the second heat sink 24. The dielectric layer 65 may have an optional thermal grease or thermally conductive adhesive between the dielectric layer 65 and the second base 30 of the second heat sink 24 to facilitate heat transfer of thermal energy away from the semiconductor device 14.

In an alternate embodiment, a lower surface 60 of the supplemental substrate 56 comprises a conductive ground plane (e.g., metallized outer layer) and the supplemental substrate 56 comprises a double-sided circuit board, where the conductive ground plane can be connected to or bonded to the second heat sink 24 via a third bonding layer of solder, or a combination of solder and copper material.

In another alternate embodiment where the supplemental substrate 56 comprises a double-sided circuit board, conductive vias or plated through holes can connect the at least one mating pad to the ground plane.

Figure 5:
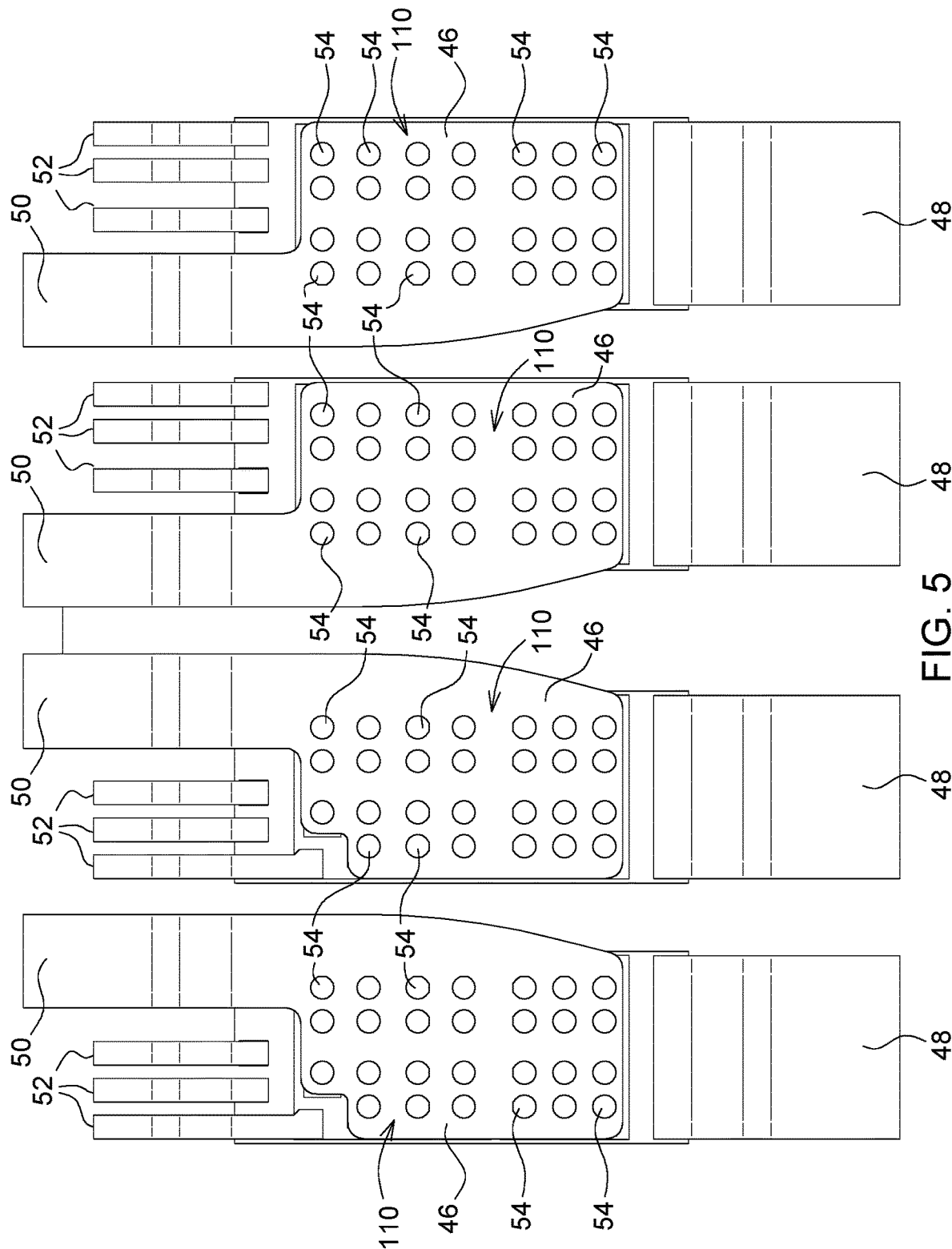
FIG. 5 is a plan view of a plurality of illustrative lead frames suitable for the electronic assembly.
Figure 9:
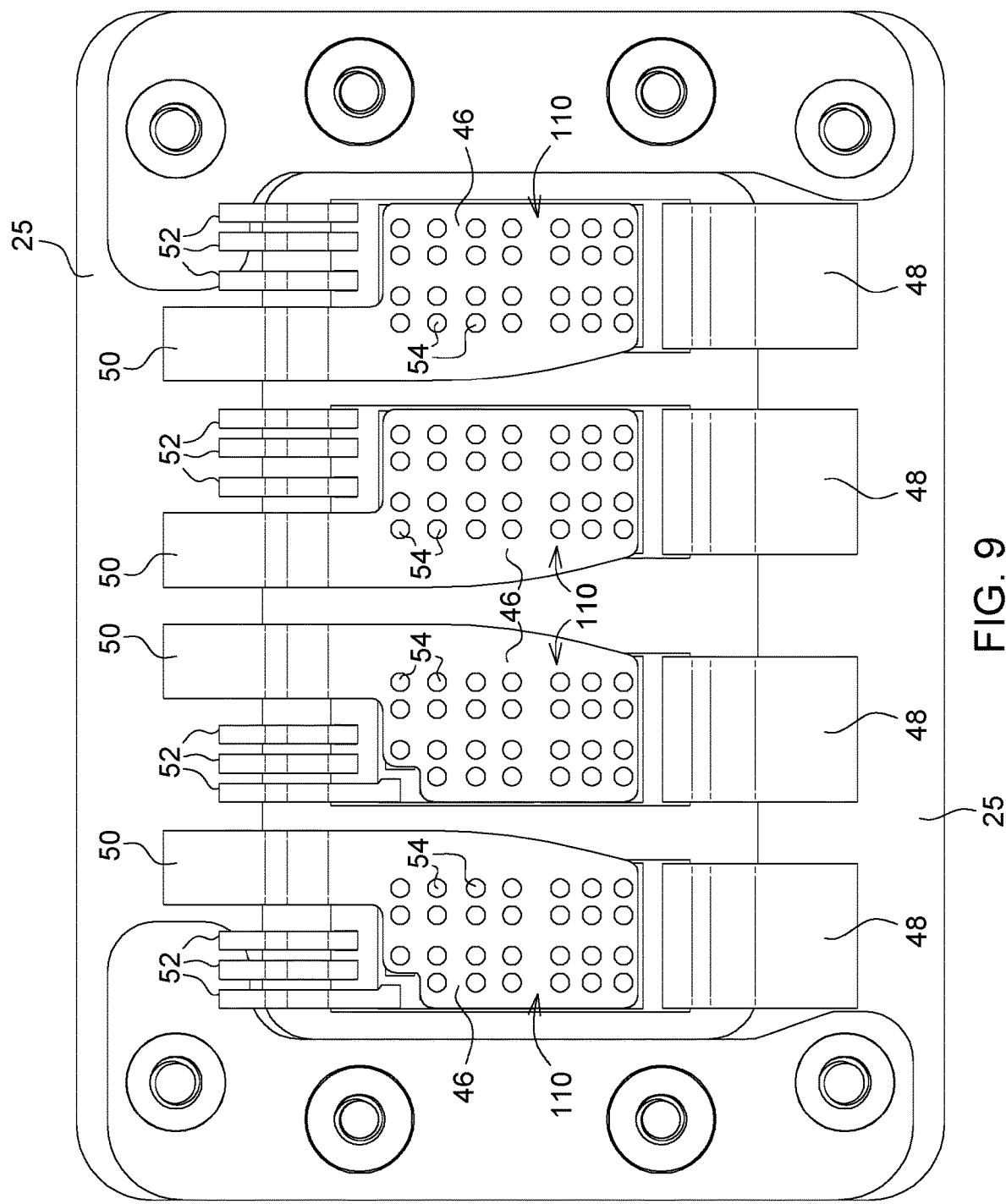
FIG. 9 is a plan view of one embodiment of a fully assembled electronic assembly.

FIG. 5 is a plan view of a plurality of illustrative lead frames 110 suitable for any of the electronic assemblies (e.g., 11, 111, 211, 311). The first substrate may comprise one or more lead frames 110. In one embodiment, the first substrate comprises a lead frame 110 having a substantially planar portion 46 with a series or grid of holes 54 for interfacing with the first bonding layer 12 (e.g., solder). As illustrated in FIG. 5 and FIG. 9, the substantially planar portion 46 of the lead frame 110 is centrally disposed for mating in registration or alignment with one or more of the following via the first bonding layer 12: (1) a corresponding first conductive pad 34, (2) a corresponding second conductive pad 38, and (3) a corresponding third conductive pad 40 of the semiconductor device 14. Further, in some embodiments, the substantially planar portion 46 of the lead frame 110 is divided or subdivided into discrete sections that are not electrically and mechanically connected, but separated by air gap or dielectric gaps to allow for multiple separate semiconductor terminals to be supported simultaneously, such as a gate terminal or base terminal, an emitter terminal or source terminal, a collector terminal or source terminal, and an anode terminal or cathode terminal.

In one embodiment, the solder outgassing holes 54 in the planar portion 46 of the lead-frames 110 can be connected to one or more semiconductor devices 14 (e.g., semiconductor dies), such as insulated gate bipolar junction transistor (IGBT) dies, diode dies, or both. Each semiconductor die may be mounted or manufactured as a direct-bonded-copper substrate.

As shown in FIG. 5, the holes 54 serve as solder outgassing outlets and also allows for the creation of an array of solder fillets on the surface of lead-frames 110 at the end of soldering. Outgassing of liquid solder supports reduced opportunity for void formation in solidified bond-layer of the first bonding layer 12. For example, reduced voiding and the presence of solder fillet on the top surface of lead-frame 110 can enhance the thermo-mechanical reliability of first bonding layer 12; hence, the assembly (11, 111, 211, or 311) or power module while in operation.

Each lead frame 110 terminates in terminals (48, 50) or fingers 52 that can be connected to other circuitry of an electronic assembly (11, 11, 211, 311) via conductors, conductive traces of circuit board 25, wire, cables, or transmission line. In one embodiment, the terminal 48 of the lead frame 110 with the largest surface area or mass (e.g., compared to the other terminals) may be assigned to the collector or drain of a semiconductor device 14; the terminal 50 of the lead frame 110 with the second largest surface area or mass may be assigned to the emitter or source of the semiconductor device 14, although other assignments of terminals are possible and fall within the scope of the claims.

Alternately, the terminal 48 of lead frame with the largest surface area or mass (e.g., compared to the other terminals) may be assigned to the emitter or source of the semiconductor device 14; the terminal 50 of the lead frame 110 with the second largest surface area or mass may be assigned to the collector or drain of the semiconductor device 14.

Figure 6:
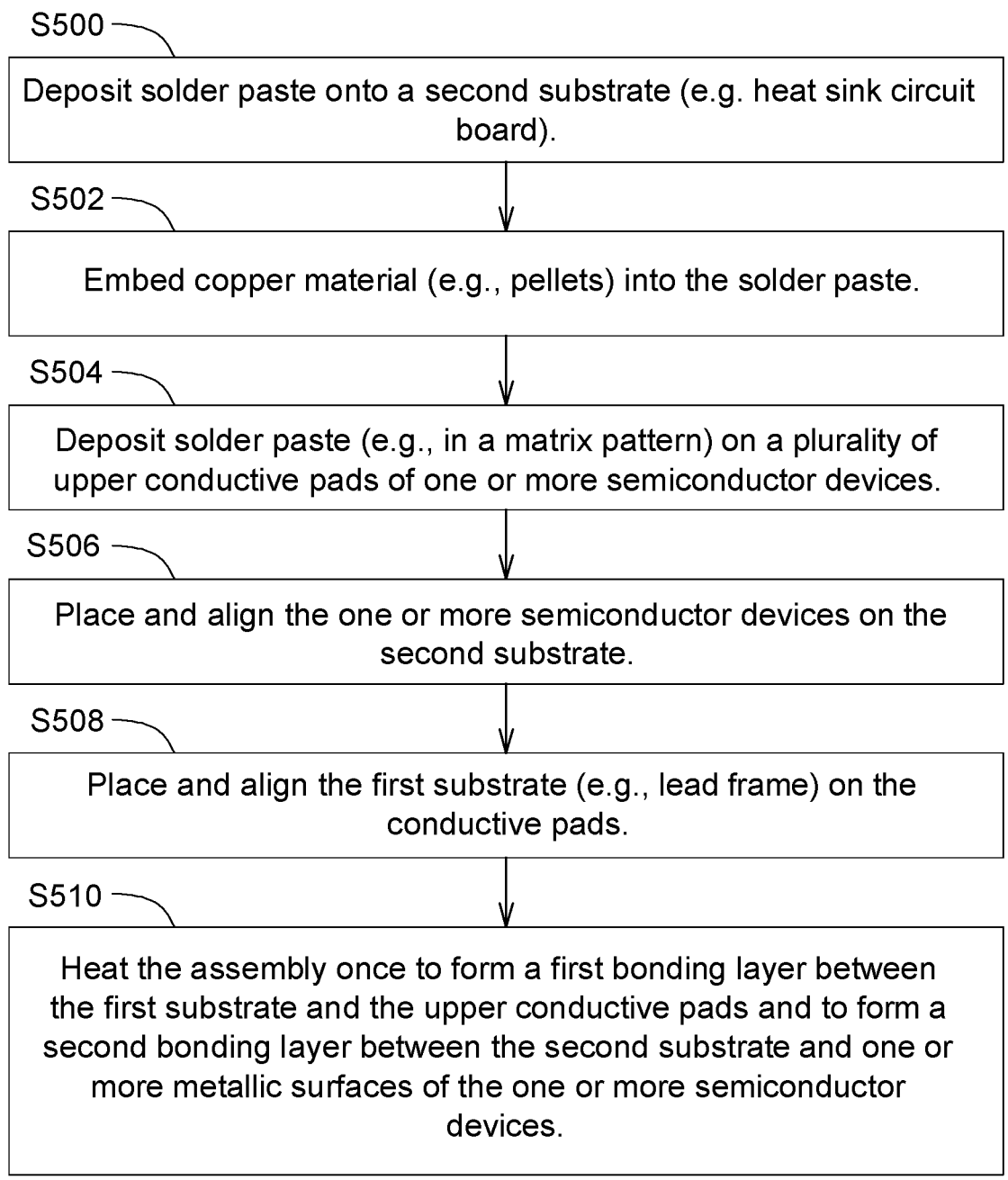
FIG. 6 is one embodiment of flow chart for a method for making an assembly with enhanced thermal dissipation.

FIG. 6 is one embodiment of flow chart for a method for making an electronic assembly (11, 111 211, or 311) with enhanced thermal dissipation. The method of FIG. 6 begins in step S500.

In step S500, solder paste is deposited onto a second substrate 18, such as a second base 30 of a second heat sink 24 or a circuit board (e.g., double-sided circuit board with ground plane and one or more conductive vias) engineered for thermal dissipation. For example, a dispenser or applicator dispenses or applies solder paste onto or to the second substrate 18.

In step S502, copper material is embedded or provided in the deposited solder paste. Step S502 may be executed before, after or during step S500. In one example, copper material is added to the solder paste during or after the depositing of the solder paste. In another example, copper pellets are added to the solder paste after the solder paste is deposited onto the second substrate 18 in step S500. The embedding or providing of the copper material can lower a homologous temperature of the second bonding layer (16 or 116) to facilitate greater mechanical strength of a bond between the second bonding layer (16 or 116) and the primary metallic surface 22, and/or a bond between the second bonding layer 16 and the secondary metallic surface 23.

In step S504, a dispenser or applicator deposits solder paste (e.g., in a matrix pattern) on a plurality of upper conductive pads (34, 38, 40) of one or more semiconductor devices 14. For example, the dispenser or applicator deposits solder paste onto the first conductive pad 34, the second conductive pads 38 and a third conductive pad 40. In one configuration, each semiconductor device 14 has a first side 42 or upper side with the first conductive pad 34, the second conductive pad 38 and the third conductive pad; each semiconductor device 14 has a second side 44 opposite the first side 42.

In step S506, one or more semiconductor devices 14 are placed and aligned on the second substrate 18 or second heat sink 24. For example, a pick-and-place machine places and aligns the one or more semiconductor devices 14 (e.g., semiconductor dies) on the second substrate 18 or on a substantially planar surface of second base 30 of the second heat sink 24.

In step S508, a first substrate 10 or one or more lead frames 110 are placed and aligned on one or more of the following: a corresponding first conductive pad 34, a corresponding second conductive pad 38 and a corresponding third conductive pad 40. For example, a pick-and-place machine places and aligns the first substrate or lead frame 110 on the corresponding first conductive pad 34 of each semiconductor device 14 to assign or allocate to the first conductive pad 34 to a first terminal of the lead frame 110, to assign or allocate to the second conductive pad 38 a second terminal of the lead frame 110, and to assign or allocate to the third conductive pad 40 a third terminal of the lead frame 110. The semiconductor manufacturer or designer assigns each conductive pad (34, 38, 40) a particular input/output port or node of the semiconductor device 14, such as a gate, source or drain terminal.

In step S510, the assembly (11, 111, 211, 311) is heated once in a single thermal cycle (e.g., only one-time in a reflow oven) to form a first bonding layer, 12 or 112, 212 and 312, (e.g., first metallic bonding layer) between the first substrate (e.g., lead frame 110) and the upper conductive pads (34, 38, 40) and to form a second bonding layer 16 or 116 (e.g., second metallic bonding layer) between the second substrate 18 (e.g., second heat sink 24) and one or more metallic surfaces (22, 23 or both), such as one or more lower conductive pads.

Step S510 may be carried out in accordance with various techniques that may be applied separately or cumulatively. Under a first technique, the assembly (11, 111, 211, 311) is heated once in a single thermal cycle (e.g., only one-time in a reflow oven) to form a first bonding layer, 12 or 112, 212 and 312, between one or more lead frames 110 and the upper conductive pads (34, 38, 40) on the first side 42 and to form a second bonding layer 16 or 116 between the second heat sink 24 and a primary metallic surface 22 (or both primary metallic surfaces 22 and secondary metallic surface 23) on the second side 44 of the one or more semiconductor devices 14.

Under a second technique, an oven heats the assembly (11, 111, 211, 311) in a soldering chamber in accordance with a thermal reflow process to form a first bonding layer 12 (e.g., first metallic bonding layer) between the first substrate 10 (e.g., lead frames 110) and the conductive pads (34, 38, 40) and to form a second bonding layer (e.g., second metallic bonding layer) between the second substrate 18 and primary metallic surfaces 22 on the second side 44 of the one or more semiconductor devices 14.

Under a third technique, the heating of the assembly (11, 111, 211) once occurs in a single heating cycle. Heating the assembly (11, 111, 211) once is well-suited for reducing a layer thickness of a solder layer intermetallic compound (in the bonding layers 12, 16) to facilitate integrity of the first bonding layer 12 and the second bonding layer 16.

Under a fourth technique, the first bonding layer 12 and the second bonding layer 16 comprise two intermetallic compound (IMC) bond-layers that are simultaneously formed through melting, wetting and spreading of the solder paste material during soldering. The IMC layers binds or bonds both the first side 42 of the semiconductor devices 14 to the lead-frames 110 and second side 44 to a heatsink (e.g., second heat sink 24) or heat-sinking circuit board. FIG. 9 shows a plan view of a fully built and functional electronic assembly (11, 111, 211) or sub-assembly for an inverter or other power electronics module.

Under a fifth technique, the first bonding layer 12 and the second bonding layer 16 are formed simultaneously during a single heating cycle or reflow process where the melting temperature range of the solder material, such as lead-free solder material should be approximately 217 degrees Celsius to approximately 230 Celsius.

Under a sixth technique, the first bonding layer 12 and the second bonding layer 16 are formed simultaneously during a single heating cycle or reflow process where the melting temperature range of the solder material, such as leaded solder paste (where lawful and applicable) is approximately 180 degrees Celsius to approximately 190 degrees Celsius.

Figure 7:
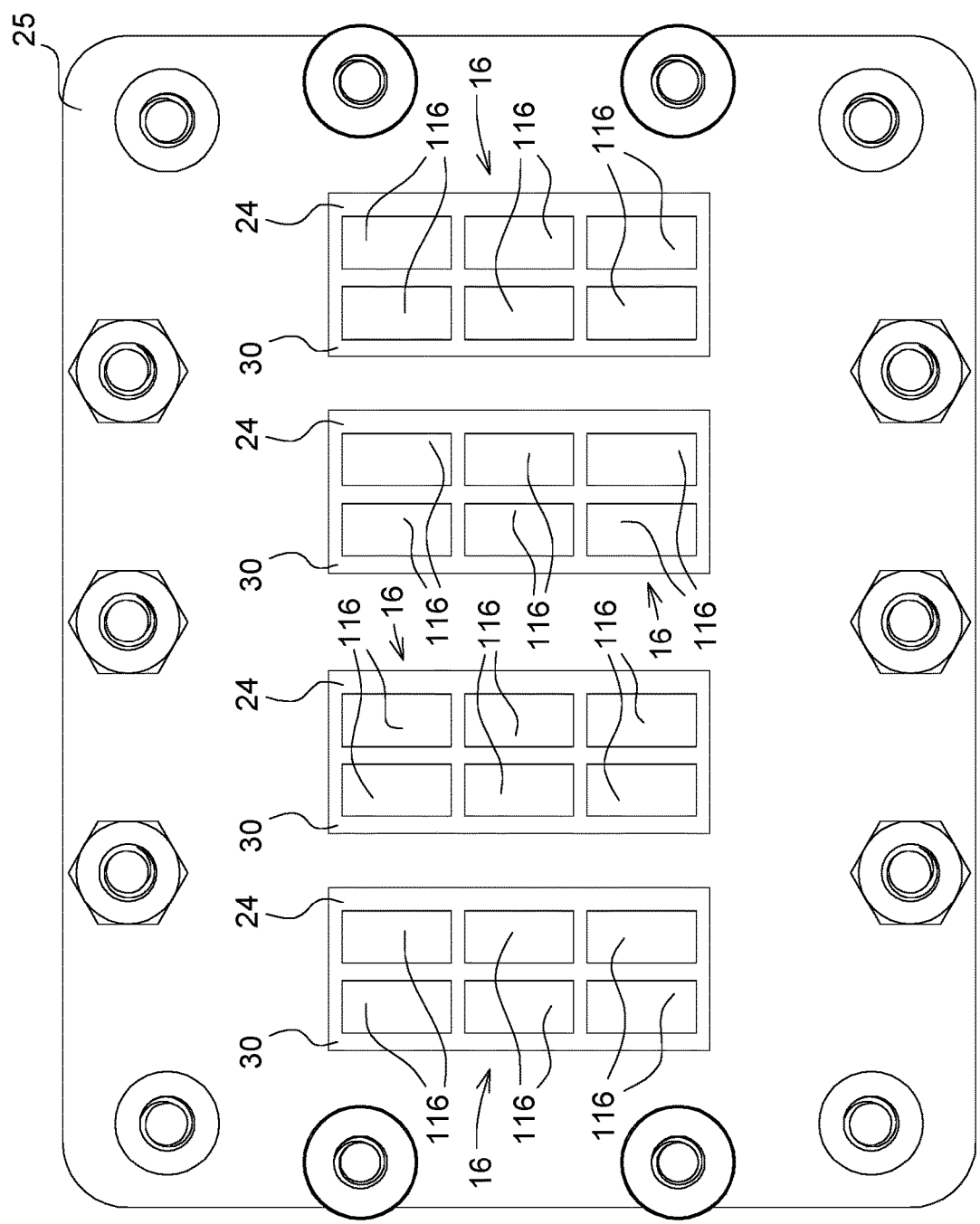
FIG. 7 is a plan view of a second substrate, such as a heat sink with solder paste on conductive members for mating with respective conductive pads on one or more semiconductor devices.

FIG. 7 is a plan view of a second substrate 18, such as a substantially planar surface of a second base 30 of a second heat sink 24 with solder paste, with or without copper material, arranged in generally rectangular matrices 116 on conductive members for mating with a respective primary metallic surface 22, secondary metallic surface 23, or both on one or more semiconductor devices 14. FIG. 7 illustrates the result or completion of step S500 of FIG. 6.

FIG. 8 is a plan view of a plurality of semiconductor devices 14 with solder paste arranged in matrices on their respective conductive pads, such as the first conductive pad 34, the second conductive pad 38 and third conductive pad 40. The conductive pads (34, 38, 40) are illustrated as generally rectangular regions that underlie a corresponding matrix of solder paste or a combination of solder paste and copper material. In one embodiment, the first matrix 112 of solder paste or combined solder paste and copper material overlies the corresponding first conductive pad 34, which is composed of copper or a copper alloy; the second matrix 212 of solder paste or combined solder paste and copper material overlies the corresponding second conductive pad 38, which is composed of copper or a copper alloy; the third matrix 312 of solder paste or combined solder paste and copper material overlies the corresponding third conductive pad 40, which is composed of copper or a copper alloy. FIG. 8 illustrates the result or completion of step S504 of FIG. 6.

FIG. 9 is a plan view of one embodiment of an electronic assembly (11, 111 or 211). FIG. 9 illustrates the result or completion of step S506, step S508, or both of FIG. 6.

In a conventional manufacturing process, the formation of each bond-layer, such as the first bonding layer 12 and the second bonding layer 16, requires one independent manufacturing cycle or heat cycle. Accordingly, two manufacturing cycles or heat cycles ordinarily would be needed to create the two bond-layers (12, 16) of the assembly (11, 111 or 211) in accordance with some conventional processes. The disclosed method and the associated structure reduces the heating or manufacturing cycles from two to one cycle, which can be referred to as single pass heating process or single pass reflow process. The single pass heating process can reduce manufacturing cost, manufacturing time, and manufacturing thermal energy input, or can increase manufacturing throughput volume of manufactured units.

Figure 10:
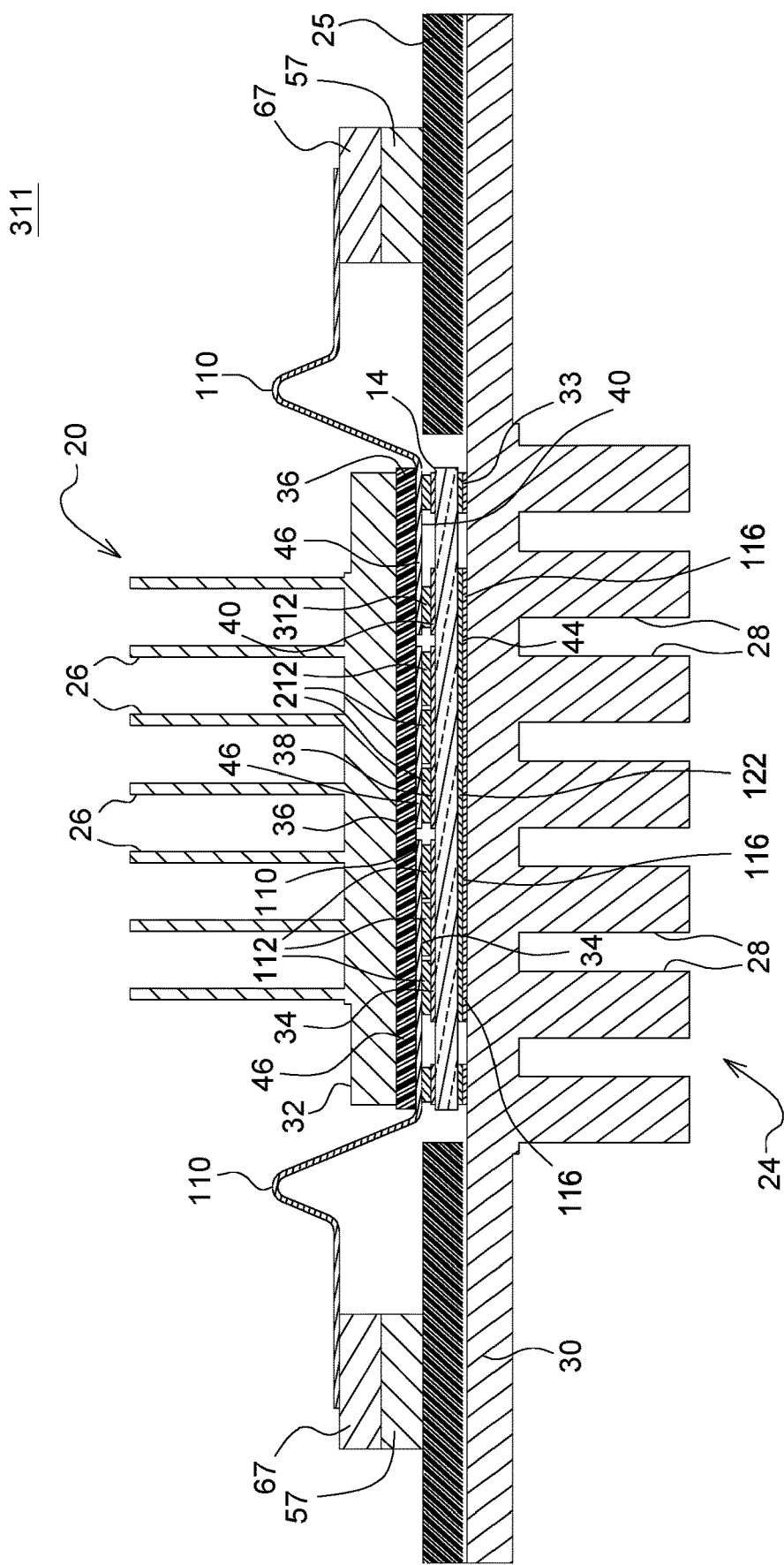
FIG. 10 is an alternate embodiment of a cross-section of an electronic assembly as viewed along reference line 10-10 of FIG. 11A.
Figure 11B:
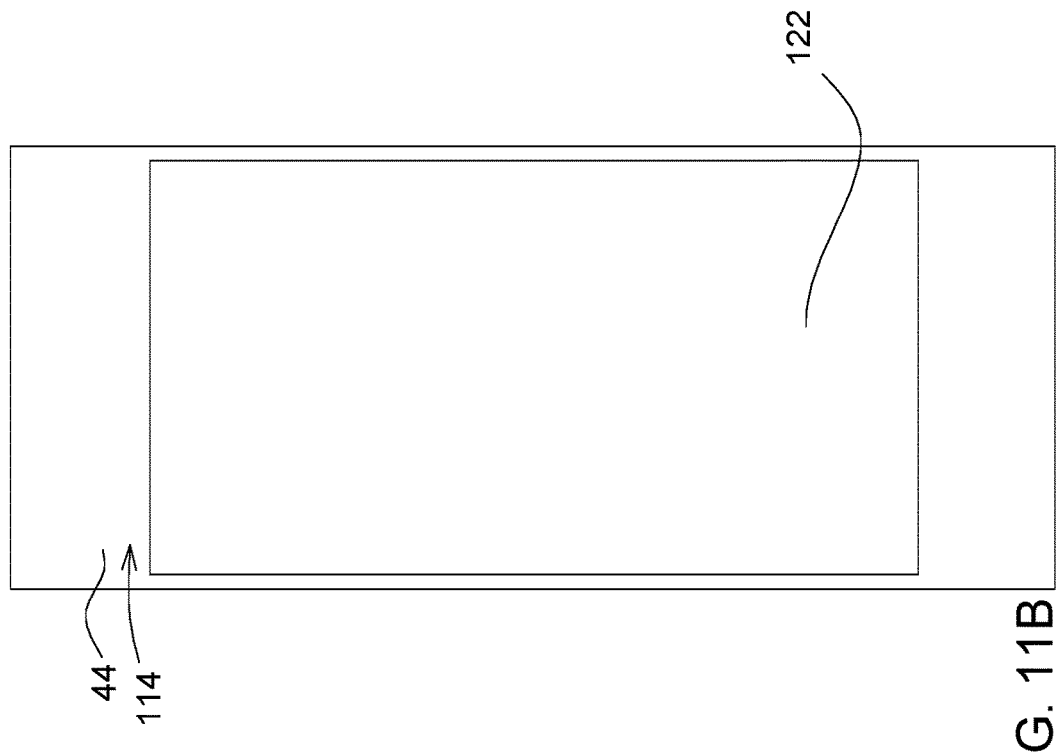
FIG. 11B is a plan view of a second side (e.g., lower side) of one illustrative embodiment of the semiconductor device, consistent with FIG. 10 and FIG. 11A.
Figure 11A:
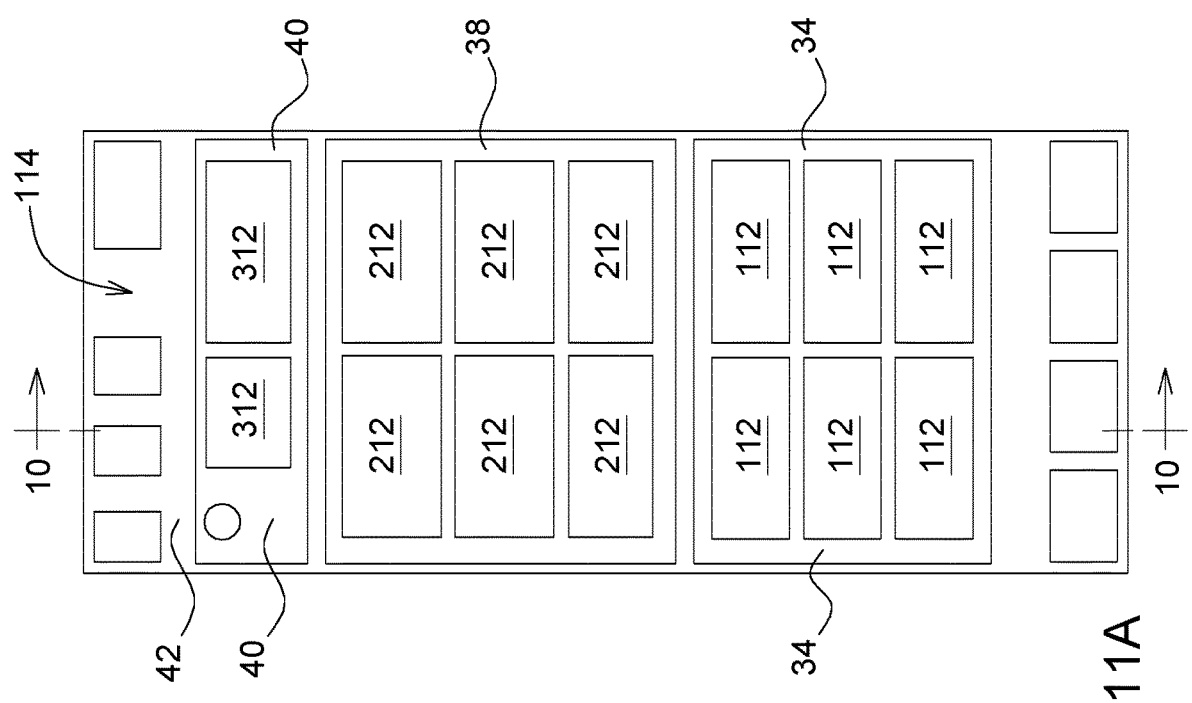
FIG. 11A is a plan view of a first side (e.g., upper side) of one illustrative embodiment of a semiconductor device in accordance with FIG. 10.

FIG. 10 is an alternate embodiment of a cross-section of an electronic assembly 311 as viewed along reference line 10-10 of FIG. 11A. The electronic assembly 311 of FIG. 10 is similar to the electronic assembly 111 of FIG. 2, except that a second side 44 of the semiconductor device 14 comprises a primary metallic surface 122 that occupies a majority of the surface area of the second side 44 to form a metallic ground plane. As illustrated in FIG. 10, of the electronic assembly 311, the second side 44 of each semiconductor device 14 has no dielectric region 45 and the second metallic surface 23 is omitted. Accordingly, the second bonding layer 16 or 116 is formed between the primary metallic surface 122 and a substantially planar surface of the second base 30 of the second heat sink 24. As previously indicated, the second bonding layer 16 may be composed of solder or a combination of solder and copper material.

FIG. 11A is a plan view of a first side (e.g., upper side) of one illustrative embodiment of a semiconductor device in accordance with FIG. 10. Like reference numbers in FIGS. 10, 11A and 11B indicate like elements or features.

FIG. 11B is a plan view of a second side (e.g., lower side) of one illustrative embodiment of the semiconductor device, consistent with FIG. 10 and FIG. 11A.

The method disclosed herein is well suited for manufacturing with lead-free solder materials, silicon semiconductors, or silicon carbide semiconductors. Solder materials may be required to comply with environmental regulations and directives, such as Directive 2011/65/EU of the European Parliament and of the council of 8 Jun. 2011. The method of electronic assembly (11, 11 or 211) facilitate cost-effective and reliable operation of the electronics assembly (11, 11 or 211) under harsh conditions such as high temperatures, high voltages and currents, high shock and vibration, and varying application environments. The method disclosed herein is also well-suited for enhanced double-sided heat dissipation that meet or exceed high temperature applications, such as those at or above 200 degrees Celsius.

Having described the preferred embodiment, it will become apparent that various modifications can be made without departing from the scope of the invention as defined in the accompanying claims.

The following is claimed:
1. A method for manufacturing an electronic assembly, the method comprising:
   depositing solder paste on a second substrate;
   embedding or providing copper material in the deposited solder paste;
   depositing solder paste on a plurality of upper conductive pads of one or more semiconductor devices, each semiconductor device having a first side with upper conductive pads and a second side opposite the first side;
   placing and aligning the one or more semiconductor devices on the second substrate;
   placing and aligning a first substrate on the upper conductive pads; and
   heating the assembly once to form a first metallic bonding layer between the first substrate and the upper conductive pads and to form a second metallic bonding layer between the second substrate and primary metallic surface on the second side of the one or more semiconductor devices, wherein the second metallic bonding layer is composed of solder and copper pellets or a copper material embedded in the solder as filler, wherein the one or more semiconductor devices have a primary coefficient of thermal expansion (CTE) and wherein the first substrate has a secondary coefficient of thermal expansion (CTE), and wherein the copper material in the first metallic bonding layer or the second metallic bonding layer, respectively, reduces a mismatch between the primary CTE and the secondary CTE.

2. The method according to claim 1 wherein the heating of the assembly once occurs in a single heating cycle.

3. The method according to claim 1 wherein the embedding or providing of copper material comprises embedding of copper pellets.

4. The method according to claim 1 wherein the embedding or providing of the copper material lowers a homologous temperature of the second metallic bonding layer to facilitate greater mechanical strength of a bond between the second metallic bonding layer and the primary metallic surface.

5. The method according to claim 1 wherein the heating the assembly once reduces a layer thickness of a solder layer intermetallic compound to facilitate integrity of the first metallic bonding layer and the second metallic bonding layer.

* * * * *